United States Patent
Han

(10) Patent No.: US 10,153,238 B2
(45) Date of Patent: Dec. 11, 2018

(54) ELECTRICAL CHANNEL INCLUDING PATTERN VOIDS

(71) Applicant: SAMSUNG DISPLAY CO., LTD., Yongin, Gyeonggi-Do (KR)

(72) Inventor: Minghui Han, San Jose, CA (US)

(73) Assignee: Samsung Display Co., Ltd., Yongin-si (KR)

(*) Notice: Subject to any disclaimer, the term of this patent is extended or adjusted under 35 U.S.C. 154(b) by 112 days.

(21) Appl. No.: 14/696,313

(22) Filed: Apr. 24, 2015

(65) Prior Publication Data

US 2016/0057852 A1 Feb. 25, 2016

Related U.S. Application Data

(60) Provisional application No. 62/039,866, filed on Aug. 20, 2014.

(51) Int. Cl.
*H01L 23/66* (2006.01)
*H01P 3/08* (2006.01)
*H05K 1/02* (2006.01)
*H05K 1/18* (2006.01)

(52) U.S. Cl.
CPC ............... *H01L 23/66* (2013.01); *H01P 3/08* (2013.01); *H05K 1/0225* (2013.01); *H05K 1/0248* (2013.01); *H01L 2223/6627* (2013.01); *H01L 2924/0002* (2013.01); *H05K 1/0243* (2013.01); *H05K 1/189* (2013.01)

(58) Field of Classification Search
CPC .. H05K 1/0242; H05K 1/0243; H05K 1/0253; H05K 2201/09318; H05K 2201/09681; H01P 1/203; H01P 1/20309; H01P 1/20318; H01P 1/20327; H01P 1/20336; H01P 1/20345; H01P 1/20354; H01P 1/20363; H01P 1/20372; H01P 1/20381; H01P 1/2039

See application file for complete search history.

(56) References Cited

U.S. PATENT DOCUMENTS 4,458,219 A * 7/1984 Vorhaus ................. H01P 1/184
333/161
4,626,889 A * 12/1986 Yamamoto ............ H01L 23/522
333/22 R (Continued)

FOREIGN PATENT DOCUMENTS

EP 1 326 302 A2 7/2003
EP 1 326 302 A3 11/2003

(Continued)

OTHER PUBLICATIONS

EPO Search Report dated May 12, 2015, corresponding to European Patent application 14196024.5, (8 pages).

(Continued)

*Primary Examiner* — Chau N Nguyen
*Assistant Examiner* — Roshn Varghese
(74) *Attorney, Agent, or Firm* — Lewis Roca Rothgerber Christie LLP

(57) ABSTRACT

A channel to be coupled to an input of a receiver, the channel including: a first transmission line including: a first trace; and a first reference plane including a plurality of first pattern voids overlapping the first trace.

17 Claims, 6 Drawing Sheets

(56) References Cited

U.S. PATENT DOCUMENTS

| | | | | |
|---|---|---|---|---|
| 5,138,287 | A * | 8/1992 | Domokos | H01P 5/12 333/12 |
| 5,374,861 | A * | 12/1994 | Kubista | H04L 25/0298 326/14 |
| 6,034,551 | A * | 3/2000 | Bridgewater, Jr. | G06F 13/4072 326/30 |
| 6,624,729 | B2 * | 9/2003 | Wright | H01P 3/081 333/238 |
| 6,765,450 | B2 * | 7/2004 | Howard | H01P 3/081 333/4 |
| 7,005,940 | B2 * | 2/2006 | Kodim | H01P 1/15 333/101 |
| 7,519,130 | B2 * | 4/2009 | Hsu | H04L 25/0274 326/30 |
| 7,564,695 | B2 | 7/2009 | Matsumoto | |
| 7,741,876 | B2 * | 6/2010 | Fusayasu | H04B 3/34 326/101 |
| 7,956,704 | B1 * | 6/2011 | Acimovic | H01P 1/203 333/181 |
| 8,081,487 | B2 * | 12/2011 | Yamagishi | H04L 25/0298 333/22 R |
| 8,283,571 | B2 | 10/2012 | Lai et al. | |
| 8,749,535 | B2 | 6/2014 | Kim et al. | |
| 2004/0066210 | A1 * | 4/2004 | Zakai | H04L 25/0272 326/30 |
| 2004/0125526 | A1 | 7/2004 | Nagode et al. | |
| 2005/0275425 | A1 * | 12/2005 | Lee | H04L 25/0298 326/30 |
| 2006/0146627 | A1 | 7/2006 | Park et al. | |
| 2007/0274238 | A1 * | 11/2007 | Kim | H04L 12/6418 370/280 |
| 2009/0152689 | A1 | 6/2009 | Nease | |
| 2009/0195327 | A1 | 8/2009 | Cho et al. | |
| 2010/0085084 | A1 | 4/2010 | Kim et al. | |
| 2011/0284279 | A1 | 11/2011 | Lai et al. | |
| 2014/0176412 | A1 | 6/2014 | Oh | |
| 2015/0109227 | A1 | 4/2015 | Shin et al. | |
| 2015/0207541 | A1 | 7/2015 | Kuroda | |

FOREIGN PATENT DOCUMENTS

| | | |
|---|---|---|
| GB | 1131115 | 10/1968 |
| JP | 2007-012661 | 1/2007 |
| KR | 10-2002-0013504 | 2/2002 |
| KR | 10-2002-0054900 | 7/2002 |
| KR | 10-2008-0022407 | 3/2008 |
| KR | 10-2010-0038825 | 4/2010 |

OTHER PUBLICATIONS

Office Action dated Sep. 3, 2015 in corresponding U.S. Appl. No. 14/535,216, (16 pages).

Office Action dated Nov. 2, 2015 in corresponding U.S. Appl. No. 14/696,311, (17) pages.

* cited by examiner

ELECTRICAL CHANNEL INCLUDING PATTERN VOIDS

CROSS-REFERENCE TO RELATED APPLICATION

This utility patent application claims priority to and the benefit of U.S. Provisional Patent Application Ser. No. 62/039,866, filed Aug. 20, 2014, entitled "ELECTRICAL SIGNALING WITH PATTERN VOIDS ON A PCB'S REFERENCE PLANES" the entire content of which is incorporated herein by reference.

BACKGROUND

Channel loss and inter-symbol interference are two major limiting factors when transmitting electrical signals over long distances at multi-Gbps data rates. Existing solutions focus on equalization schemes inside the transmitter and receiver chips, such as finite impulse response filters (FIRs), continuous time linear equalizers (CTLEs), and decision feedback equalizers (DFEs). However, these chip-level solutions are process technology dependent, have relatively high power consumption, and have large performance variations across different process, voltage, and temperature (PVT) corners.

On the other hand, board (e.g., printed circuit board "PCB") level solutions may supplement the chip-level solutions, especially when the chip-level solutions do not perform as well as expected. For example, board level solutions may help alleviate the financial costs and time associated with re-designing the chip-level solutions, may be independent of silicon process technologies, may have little or no additional power consumption overhead, and may have smaller performance variations.

The above information disclosed in this Background section is only for enhancement of understanding of the background of the invention, and therefore, it may contain information that does not form prior art.

SUMMARY

Aspects of one or more embodiments of the present invention relate to a channel for increasing the quality of received signals, a circuit board including the channel, and an electronic device including the channel.

According to an embodiment of the present invention, an electronic device includes: a transmitter; a receiver coupled to the transmitter; and a first transmission line coupled between the transmitter and the receiver, the first transmission line including: a first trace; and a first reference plane including a plurality of first pattern voids overlapping the first trace.

Each of the plurality of first pattern voids may extend through the first reference plane.

A first end of the first transmission line may be coupled to the transmitter and a second end of the first transmission line may be coupled to the receiver.

The electronic device may further include: a second transmission line, a first end of the second transmission line may be coupled to the transmitter and a second end of the second transmission line may be coupled to the receiver, and the first transmission line may be coupled to the second end of the second transmission line at an input of the receiver.

The second transmission line may include: a second trace; and a second reference plane including a plurality of second pattern voids overlapping the second trace.

The second transmission line may include: a second trace; and a second reference plane having a continuous thickness along the second trace.

According to another embodiment of the present invention, a circuit board includes: a first terminal to be coupled to a transmitter; a second terminal to be coupled to a receiver; and a first transmission line coupled between the transmitter and the receiver, the first transmission line including: a first trace; and a first reference plane including a plurality of first pattern voids overlapping the first trace.

Each of the plurality of first pattern voids may extend through the first reference plane.

A first end of the first transmission line may be coupled to the transmitter and a second end of the first transmission line may be coupled to the receiver.

The circuit board may further include: a second transmission line, a first end of the second transmission line may be coupled to the transmitter and a second end of the second transmission line may be coupled to the receiver, and the first transmission line may be coupled to the second end of the second transmission line at an input of the receiver.

The second transmission line may include: a second trace; and a second reference plane including a plurality of second pattern voids overlapping the second trace.

The second transmission line may include: a second trace; and a second reference plane having a continuous thickness along the second trace.

According to another embodiment of the present invention, a channel to be coupled to an input of a receiver includes: a first transmission line including: a first trace; and a first reference plane including a plurality of first pattern voids overlapping the first trace.

Each of the plurality of first pattern voids may extend through the first reference plane.

A first end of the first transmission line may be coupled to a transmitter and a second end of the first transmission line may be coupled to the receiver.

The channel may further include: a second transmission line, a first end of the second transmission line may be coupled to a transmitter and a second end of the second transmission line may be coupled to the receiver, and the first transmission line may be coupled to the second end of the second transmission line at an input of the receiver.

A first end of the first transmission line may be coupled to the second end of the second transmission line, and a second end of the first transmission line may be terminated with a resistor.

The second transmission line may include: a second trace; and a second reference plane having a continuous thickness along the second trace.

The second transmission line may include: a second trace; and a second reference plane including a plurality of second pattern voids overlapping the second trace.

Each of the plurality of first pattern voids may extend through the first reference plane, and each of the plurality of second pattern voids may extend through the second reference plane.

BRIEF DESCRIPTION OF THE DRAWINGS

The above and other aspects and features of the present invention will become apparent to those skilled in the art from the following detailed description of the example embodiments with reference to the accompanying drawings.

DETAILED DESCRIPTION

Figure 1A:
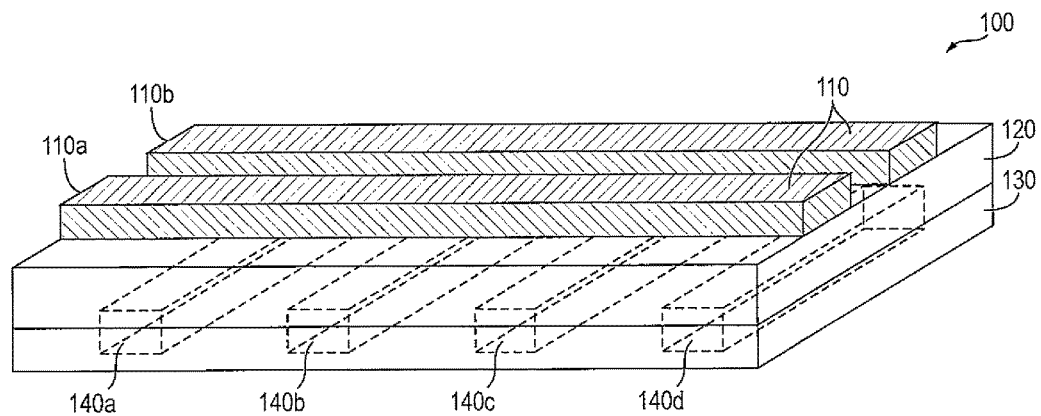
FIG. 1A illustrates a perspective view of a transmission line including pattern voids in a reference plane below a location of a trace, according to some embodiments of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and components and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or the like.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Generally, traces (e.g., printed circuit board traces) for high-speed signaling reference to a uniform reference plane (e.g., a power plane or a ground plane). Voids on the reference plane are generally avoided, as the voids may cause discontinuities in the traces' characteristic impedance, which may cause unwanted reflections.

According to some embodiments of the present invention, however, pattern voids are included in the reference plane at locations corresponding to the traces, and the resulting reflections may exhibit strong frequency dependence, which may increase the quality of the signaling. For example, in some embodiments, transmission in low frequencies may be suppressed, which may help to reduce inter-symbol interference. In some embodiments, transmission in high frequencies may be enhanced, which may compensate for signal attenuation from metal and dielectric losses. In some embodiments, transmission in low frequencies may be suppressed and transmission in high frequencies may be enhanced.

As will be described in more detail below, the reflections caused by the pattern voids included in the reference plane may be controlled at certain frequencies (e.g., predetermined or desired frequencies), so that the quality of the signaling may be increased.

Figure 1B:
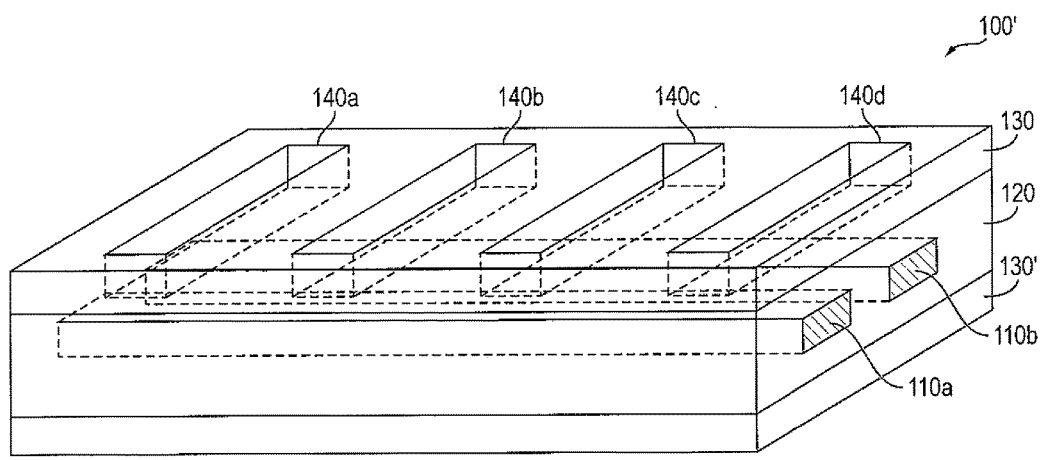
FIG. 1B illustrates a perspective view of a transmission line including pattern voids in a reference plane above a location of a trace, according to some embodiments of the present invention.

FIG. 1A illustrates a perspective view of a transmission line including pattern voids in a reference plane below a location of a trace, according to some embodiments of the present invention, and FIG. 1B illustrates a perspective view of a transmission line including pattern voids in a reference plane above a location of a trace, according to some embodiments of the present invention.

Referring to FIGS. 1A and 1B, the transmission line 100 may include one or more traces 110a and 110b, an insulating substrate (e.g., a dielectric layer) 120, and one or more reference planes (e.g., a power or ground plane) 130 and 130'. The insulating substrate 120 may include any suitable insulating or dielectric material. The trace 110 and the reference planes 130 and 130' may include any suitable metal or conductive material.

For convenience of description the one or more traces 110a and 110b will be described hereafter as the trace 110, and the one or more reference planes 130 and 130' will be described hereafter as the reference plane 130, unless otherwise specified.

The insulating substrate 120 may be formed on the reference plane 130, and the trace 110 may be insulated (e.g., separated) from the reference plane 130 by the insulating substrate 120. The reference plane 130 may include one or more pattern voids 140a, 140b, 140c, and 140d located below and/or above the trace 110 and overlapping the trace 110. For convenience of description, the one or more patterned voids 140a, 140b, 140c, and 140d will be described hereafter as the patterned voids 140, unless otherwise specified.

As shown in FIG. 1A, the transmission line 100 may be, for example, a microstrip transmission line, and thus, the reference plane 130 may be below the trace 110. However, the present invention is not limited thereto, and as shown in FIG. 1B, the transmission line 100' may be, for example, a stripline including the reference plane 130 above the trace 110 and a reference plane 130' below the trace 110. Thus, for convenience of description, the transmission line 100 and the transmission line 100' will be described hereafter as the transmission line 100, unless otherwise specified.

The transmission line 100 including the pattern voids 140 may be formed using any suitable manufacturing process. For example, the pattern voids 140 may be formed in the reference plane 130 by at least partially etching away a portion of the reference plane 130 overlapping the trace 110. The insulating substrate 120 may be formed on the reference plane 130, and the pattern voids 140 may be filled with the insulating substrate 120. The trace 110 may be formed on the insulating substrate 120.

As will be described in more detail below, the pattern voids 140 may be utilized to control reflections of signals propagating through the trace 110 to enhance and/or suppress the signals at certain frequencies (e.g., predetermined or desired frequencies).

Figure 2A:
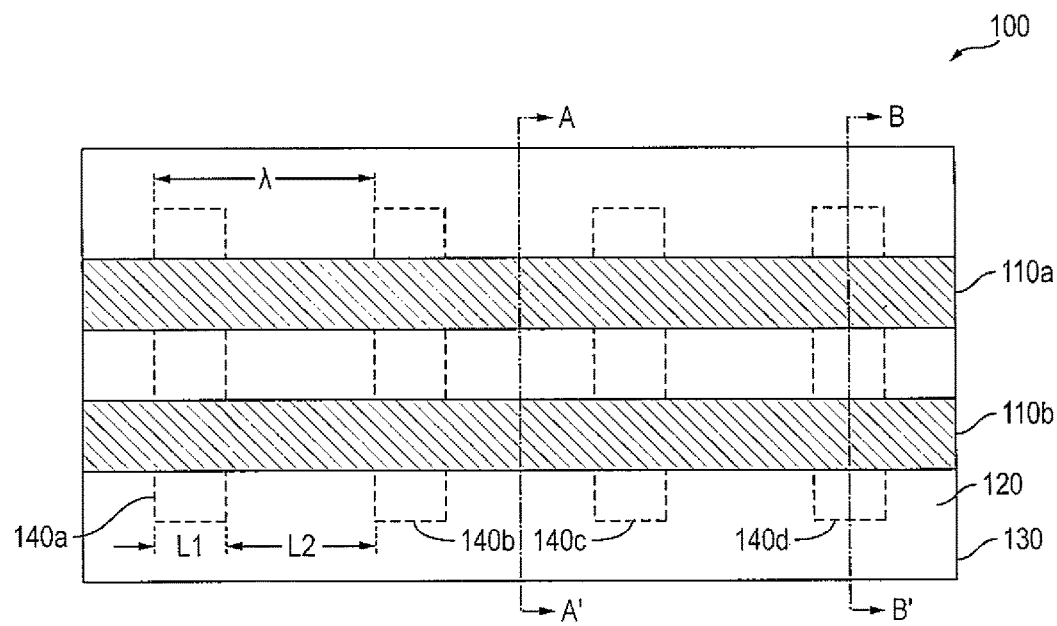
FIG. 2A illustrates a plan view of the transmission line shown in FIG. 1A.
Figure 2B:
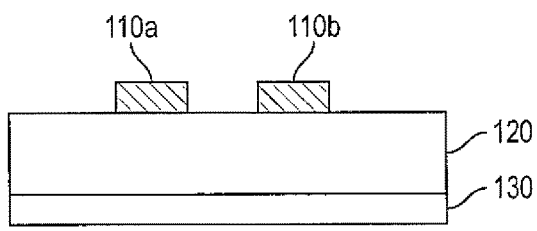
FIG. 2B illustrates a cross-sectional view taken along the line A-A' of the transmission line shown in FIG. 2A.
Figure 2C:
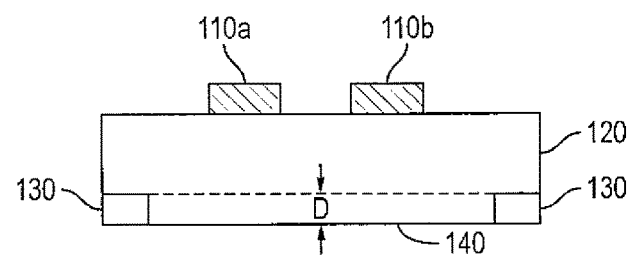
FIG. 2C illustrates a cross-sectional view taken along the line B-B' of the transmission line shown in FIG. 2A.

FIG. 2A illustrates a plan view of the transmission line 100 shown in FIG. 1A, FIG. 2B illustrates a cross-sectional view taken along the line A-A' of the transmission line shown in FIG. 2A, and FIG. 2C illustrates a cross-sectional view taken along the line B-B' of the transmission line shown in FIG. 2A. For ease of description, FIGS. 2A through 2C are shown and described in the context of a transmission line 100 including a reference plane 130 only below the trace 110 as shown in FIG. 1A above, for example, as in a microstrip transmission line. However, the present invention is not limited thereto, and as described with reference to FIG. 1B above, the reference planes 130 and 130' may be included above and below the trace 110 such as, for example, in the case of a stripline transmission line. When the transmission line 100 includes the reference planes 130 and 130' above and below the trace 110, the pattern voids 140 may be included on the reference plane 130 above the trace 110 and/or on the reference plane 130' below the trace 110.

Referring to FIGS. 2A through 2C, the reference plane 130 may include the pattern voids 140 arranged periodically in the reference plane to overlap with the trace 110. In FIG. 2A, four voids are shown as an example, but the present invention is not limited thereto. The trace 110 may extend in a first direction, and the pattern voids 140 may be arranged along the first direction and may extend in a second direction crossing the first direction.

Each period may include a period length $\Lambda$ (e.g., a physical length parallel to the first direction), and the period length $\Lambda$ of each of the periods may be equal to each other. However, the present invention is not limited thereto, and or one or more period lengths $\Lambda$ of one or more periods may be different from that of one or more other periods.

The period length $\Lambda$ may include a length L1 (e.g., an entire length parallel to the first direction) of a corresponding pattern void and a length L2 (e.g., an entire length parallel to the first direction) of a portion of the reference plane between the corresponding pattern void and an adjacent pattern void. The length L1 and the length L2 may be equal to each other or may be different from each other. When the length L2 is greater than the length L1, the strength of corresponding reflections may be reduced.

As shown in FIG. 2B, the trace 110 may be separated from the reference plane 130 by the insulating substrate 120, and as shown in FIGS. 2A and 2C, each of the pattern voids 140a, 140b, 140c, and 140d may be overlapped with the trace 110 and may cross the trace 110.

As shown in FIG. 2C, a depth D of the pattern voids 140 may be equal to a thickness of a portion of the reference plane 130 overlapping the trace 110. In other words, the pattern voids 140 may extend entirely through the reference plane 130 in a thickness direction of the reference plane 130. However, the present invention is not limited thereto, for example, in some embodiments, the depth D of the pattern voids 140 may be less than a thickness of a portion of the reference plane 130 overlapping the trace 110, and/or the pattern voids 140 may not extend entirely through the reference plane 130 in the thickness direction of the reference plane 130.

According to some embodiments of the present invention, a shape (e.g., when viewed in a plan view) of the pattern voids 140 may be substantially rectangular. However, the present invention is not limited thereto, and in some embodiments, the shape (e.g., when viewed in a plan view) of the pattern voids 140 may be any suitable shape, for example, such as squares, circles, hexagons, triangles, trapezoids, etc. Further, in some embodiments, the shape (e.g., when viewed in a plan view) of one or more pattern voids 140 may be different from that of one or more other pattern voids 140. Regardless of the shape, however, the pattern voids 140 may be arranged periodically to overlap the trace 110, and each period may have a period length $\wedge$ as discussed above.

According to some embodiments of the present invention, a total reflection of the periods may peak at a frequency f defined by equation (1) below, when individual reflections from each period are in phase with one another.

$$f = \left(n + \frac{1}{2}\right) \frac{v_{\mathit{eff}}}{\wedge} \quad (1)$$

In equation (1), $\wedge$ is the physical length of each period, $V_{\mathit{eff}}$ is the effective signal propagation speed in each period, and n is an integer greater than or equal to 0 (n>=0).

As will be further described in detail with reference to FIGS. 3A to 5, the transmission line 100 including the reference plane 130 having the pattern voids 140 may enhance the quality of the signal received by a receiver by suppressing certain (e.g., predetermined or desired) frequencies (e.g., low frequencies) and/or by enhancing certain (e.g., predetermined or desired) frequencies (e.g., high frequencies) according to equation (1), when compared to a transmission line without the pattern voids 140.

Figure 3A:
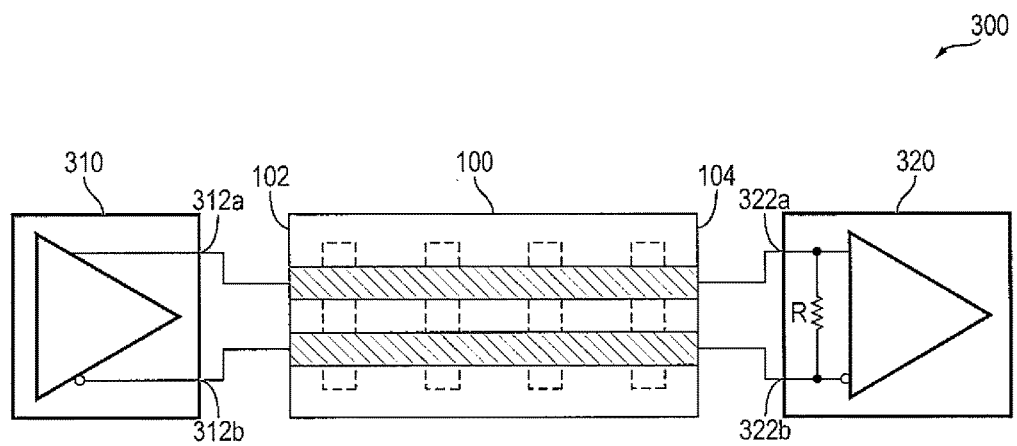
FIG. 3A illustrates an example of a transmission line including pattern voids coupled between devices to suppress the transmission of signals propagating through the transmission line at certain frequencies, according to some embodiments of the present invention.
Figure 3B:
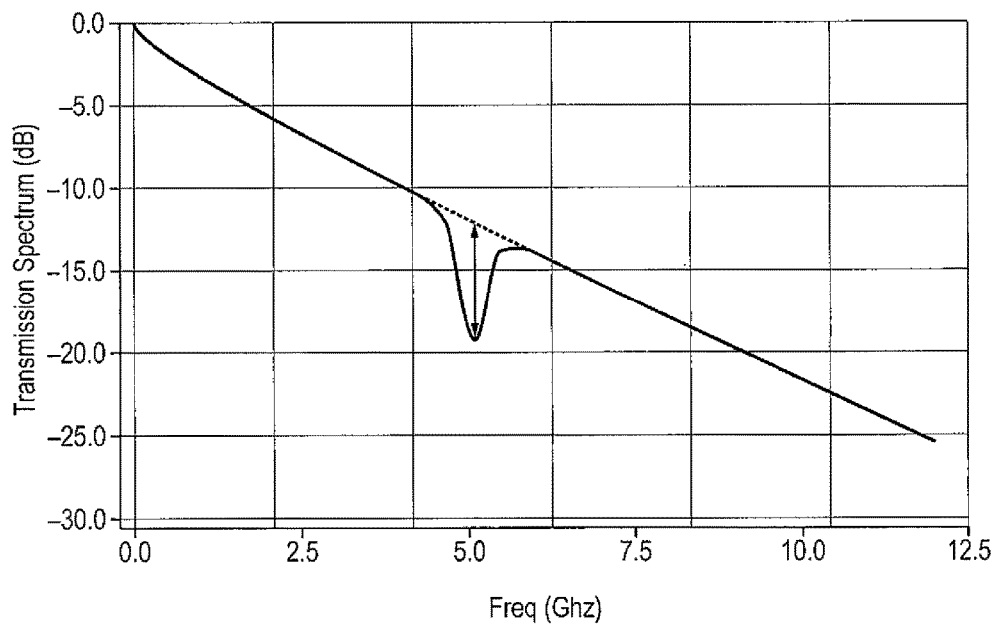
FIG. 3B illustrates a graph comparing received signals at a receiver through a transmission line without the pattern voids and a transmission line including the pattern voids according to some embodiments of the present invention.

FIG. 3A illustrates an example of a transmission line including pattern voids coupled between devices to suppress the transmission of signals propagating through the transmission line at certain frequencies according to some embodiments of the present invention, and FIG. 3B illustrates a graph comparing received signals at a receiver through a transmission line without the pattern voids and through a transmission line including the pattern voids according to some embodiments of the present invention.

Referring to FIG. 3A, a circuit or circuit board 300 includes a first terminal to be coupled to a transmitter 310, a second terminal to be coupled to a receiver 320, and a channel (e.g., a data channel, data bus, data path, etc.) including the transmission line 100 including the pattern voids as described above with reference to FIGS. 1A through 2C. The circuit board 300 may include any suitable circuit structure, for example, a printed circuit board (PCB), a flexible printed circuit board (FPCB), etc.

The transmission line 100 is coupled between the transmitter 310 and the receiver 320, and transmits signals between the transmitter 310 and the receiver 320. That is, a first end 102 of the transmission line 100 is coupled to an output 312a and 312b of the transmitter 310, and a second end (104) of the transmission line 100 is coupled to an input 322a and 322b of the receiver 320. When the transmission line 100 having the pattern voids is coupled between the transmitter 310 and the receiver 320 as shown in FIG. 3A, the signal propagating through the transmission line 100 may be suppressed at certain frequencies (e.g., predetermined or desired frequencies).

For example, referring to FIG. 3B, the dotted line represents a received signal through a transmission line without the pattern voids and the solid line represents a received signal through the transmission line 100 including the pattern voids like that shown in FIG. 3A.

For the purpose of illustration, FIG. 3B assumes that a design goal is to send data at a rate of 20 gigabits/second (Gb/s) over a 600 millimeter (mm) long trace (e.g., double-data rate operation). Eye opening of the signal at the receiver may be limited by signal components at frequencies less than 10 gigahertz (GHz) interfering with signal components at a frequency of 10 GHz. Thus, by suppressing the signal components at frequencies less than 10 GHz, in combination with existing techniques such as equalization methods implemented at the transmitter and receiver, improvement of the eye opening at the receiver may be achieved.

As shown in FIG. 3B, by including 16 periods of the pattern voids in the transmission line 100, each period having a period length $\wedge$ of about 15 mm, transmission at 5 GHz may be reduced by about 7 dB when compared to the transmission line without the pattern voids. However, FIG. 3B is provided as an example only, and thus, the present invention is not limited thereto. For example, adjusting the number of periods may adjust a magnitude or sharpness of the reduction, and adjusting the period length $\wedge$ may adjust a location of the suppression (e.g., the desired frequency to be suppressed).

Figure 4A:
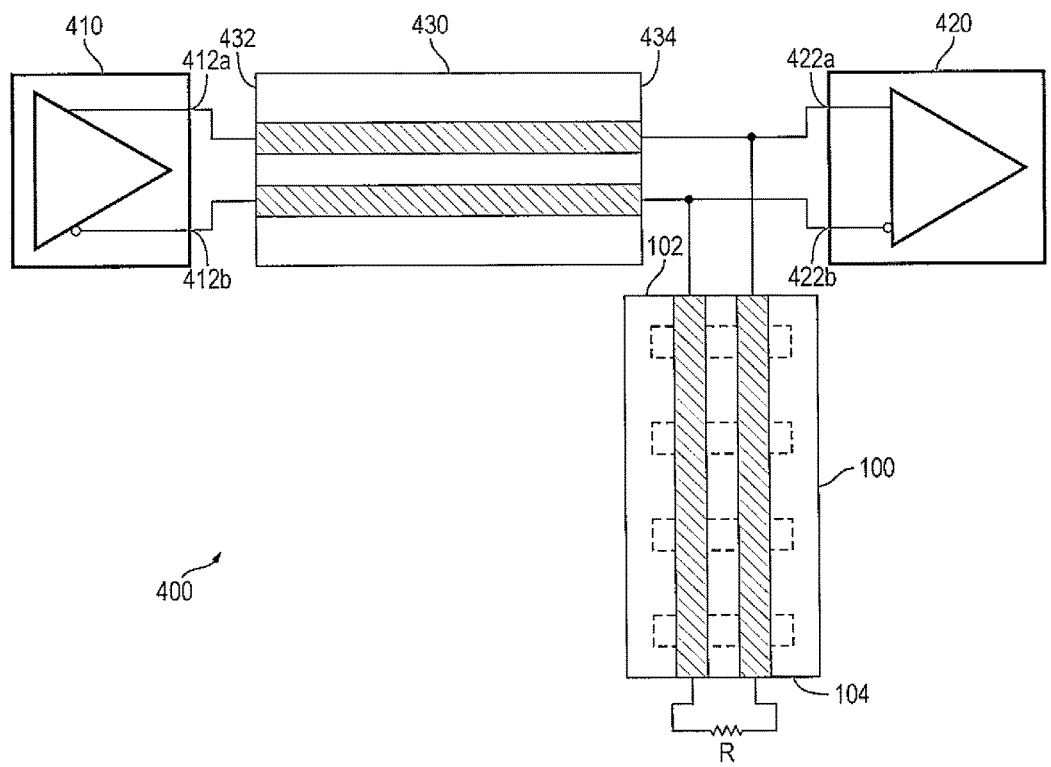
FIG. 4A illustrates an example of a transmission line including pattern voids coupled between devices to enhance the transmission of signals propagating through the transmission line at certain frequencies according to some embodiments of the present invention.
Figure 4B:
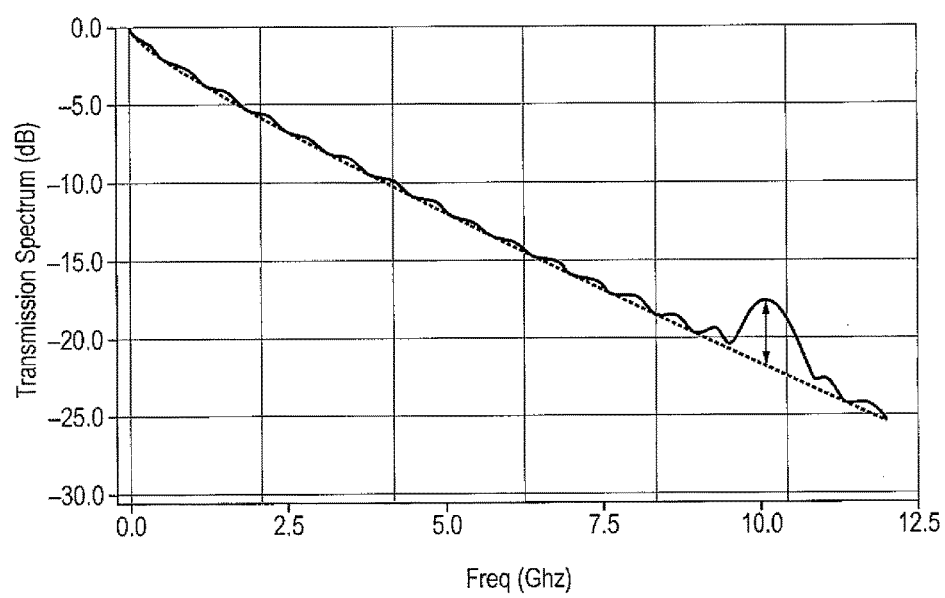
FIG. 4B illustrates a graph comparing received signals at a receiver through a transmission line without the pattern voids and a transmission line including the pattern voids according to some embodiments of the present invention.

FIG. 4A illustrates an example of a transmission line including pattern voids coupled between devices to enhance the transmission of signals propagating through the transmission line at certain frequencies according to some embodiments of the present invention, and FIG. 4B illustrates a graph comparing received signals at a receiver through a transmission line without the pattern voids and through a transmission line including the pattern voids according to some embodiments of the present invention.

Referring to FIG. 4A, a circuit or circuit board 400 includes a first terminal to be coupled to a transmitter 410, a second terminal to be coupled to a receiver 420, and a channel including a first transmission line 100 including the pattern voids as described above with reference to FIGS. 1A through 2C, and a second transmission line 430 without the pattern voids. In other words, the first transmission line 100 may include a first trace and a first reference plane having a plurality of first voids overlapping the first trace. The second transmission line 430 may include a second trace and a second reference plane having a continuous (e.g., uniform or substantially uniform) thickness along the second trace. The circuit board 400 may include any suitable circuit structure, for example, a PCB, a FPCB, etc.

The first and second transmission lines 100 and 430 are coupled between the transmitter 410 and the receiver 420, and transmit signals between the transmitter 410 and the receiver 420. That is, a first end 432 of the second transmission line 430 is coupled to an output 412a and 412b of the transmitter 410, and a second end 434 of the second transmission line 430 is coupled to an input 422a and 422b of the receiver 420. The first transmission line 100 including the pattern voids is coupled to the second transmission line 430 near (or at) the second end 434 of the second transmission line 430 that is coupled to the input 422a and 422b of the receiver 420. In other words, the first end 102 of the first transmission line 100 is coupled near (or at) the second end 434 of the second transmission line 430 that is coupled to the input 422a and 422b of the receiver 420.

The second end 104 of the first transmission line 100 may be terminated for reflection control, and to set a DC bias of the input 422a and 422b of the receiver 420. For example, the second end 104 of the first transmission line 100 may be terminated with a resistor R. The resistor R may have the same or substantially the same impedance value as that of the second transmission line 430, and the input 422a and 422b of the receiver 420 may be left unterminated as shown in FIG. 4A. However, the present invention is not limited thereto. For example, the impedance of the resistor R may be any suitable impedance, and the input 422a and 422b of the receiver 420 may be terminated within the receiver chip as well. For example, the impedance of the resistor R may be experimentally determined based on a desired reflection property of the first transmission line 100. If the input of the receiver 420 is also terminated within the receiver chip, the reflection properties of the first transmission line 100 may be fine-tuned with various different combinations of the impedance value of the resistor R and the impedance value of the terminated input within the receiver chip.

When the first and second transmission lines 100 and 430 are coupled between the transmitter 410 and the receiver 420 as shown in FIG. 4A, the first transmission line 100 may enhance reflections of the signal propagating therethrough at certain frequencies (e.g., predetermined or desired frequencies).

For example, referring to FIG. 4B the dotted line represents a received signal through the second transmission line 430 without the first transmission line 100 including the pattern voids coupled thereto, and the solid line represents a received signal through the second transmission line 430 and the first transmission line 100 including the pattern voids coupled to the second transmission line 430 like that shown in FIG. 4A.

For the purpose of illustration, FIG. 4B assumes that the design goal is the same as that of FIG. 3B, that is, to send data at a rate of 20 Gb/s over a 600 mm long trace (e.g., double-data rate operation). The eye opening of the signal at the receiver may also be limited by attenuation (e.g., severe attenuation) of the signal component at a frequency equal to 10 GHz. Thus, by enhancing the signal component at the frequency equal to 10 GHz, improvement of the eye opening at the receiver may be achieved.

As shown in FIG. 4B, by including 16 periods of the pattern voids in the first transmission line 100 coupled to the second transmission line 430 near the input of the receiver 420, each period having a period length $\wedge$ of about 9 mm, transmission at 10 GHz may be enhanced by more than 4 dB when compared to the second transmission line 430 without the first transmission line 100 coupled thereto. However, FIG. 4B is provided as an example only, and thus, the present invention is not limited thereto. For example, adjusting the number of periods may adjust a magnitude or sharpness of the enhancement, and adjusting the period length $\wedge$ may adjust a location of the enhancement (e.g., the desired frequency to be enhanced).

Figure 5:
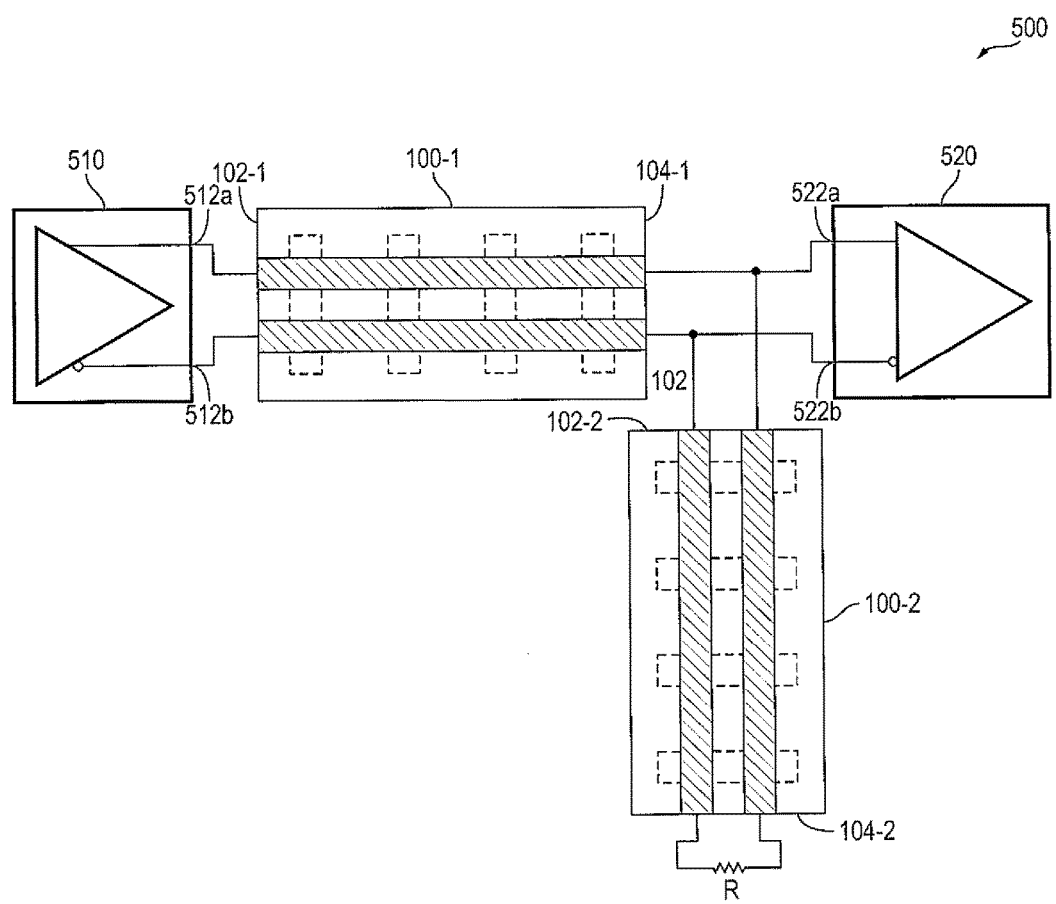
FIG. 5 illustrates an example of a transmission line including pattern voids coupled to a transmitter and a receiver to enhance and suppress the transmission of signals propagating through the transmission line at certain frequencies, according to some embodiments of the present invention.

FIG. 5 illustrates an example of a transmission line including pattern voids coupled to a transmitter and a receiver to enhance and suppress the transmission of signals propagating through the transmission line at certain frequencies according to some embodiments of the present invention.

Referring to FIG. 5, a circuit or circuit board 500 includes a first terminal to be coupled to a transmitter 510, a second terminal to be coupled to a receiver 520, and a channel including a first transmission line 100-1 including the pattern voids as described above with reference to FIGS. 1A through 2C, and a second transmission line 100-2 including the pattern voids as described above with reference to FIGS. 1A through 2C. The circuit board 500 may include any suitable circuit structure, for example, a PCB, a FPCB, etc.

The first and second transmission lines 100-1 and 100-2 are coupled between the transmitter 510 and the receiver 520, and transmit signals between the transmitter 510 and the receiver 520. That is, a first end 102-1 of the first transmission line 100-1 is coupled to an output 512a and 512b of the transmitter 510, and a second end 104-1 of the first transmission line 100-1 is coupled to an input 522a and 522b of the receiver 520. The second transmission line 100-2 is coupled to the first transmission line 100-1 near (or at) the second end 104-1 of the first transmission line 100-1 that is coupled to the input 522a and 522b of the receiver 520. In other words, the first end 102-2 of the second transmission line 100-2 is coupled near (or at) the second end 104-1 of the first transmission line 100-1 that is coupled to the input 522a and 522b of the receiver 520.

The second end 104-2 of the second transmission line 100-2 may be terminated for reflection control, and to set a DC bias of the input 522a and 522b of the receiver 520. For example, the second end 104-2 of the second transmission line 100-2 may be terminated with a resistor R.

The first transmission line 100-1 may include a first trace and a first reference plane including a plurality of first voids overlapping the first trace. The second transmission line 100-2 may include a second trace and a second reference plane including a plurality of second voids overlapping the second trace. The first transmission line 100-1 and the second transmission line 100-2 may be the same or substantially the same as that of FIGS. 1 through 4A described above, respectively, and thus, detailed description thereof will be omitted. Thus, when the first and second transmission lines 100-1 and 100-2 are coupled between the transmitter 510 and the receiver 520 as shown in FIG. 5, the first transmission line 100-1 may suppress reflections of the signal propagating therethrough at a first frequency (e.g., a predetermined or desired frequency), and the second transmission line 100-2 may enhance reflections of the signal propagating therethrough at a second frequency (e.g., predetermined or desired frequency) different from the first frequency. According to some embodiments, the first frequency may be lower than the second frequency.

Figure 6:
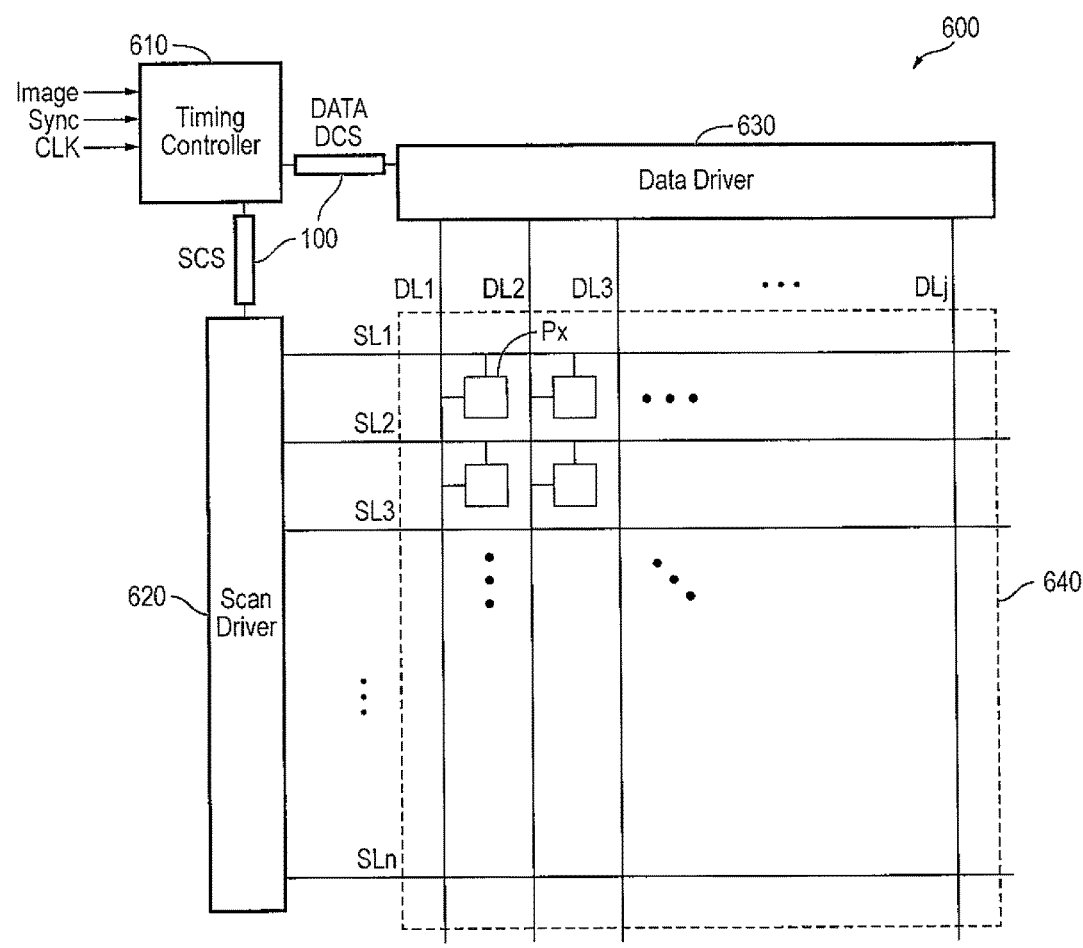
FIG. 6 illustrates an example application of a transmission line including a reference plane having pattern voids corresponding to a location of a trace in the context of an electronic device, according to some embodiments of the present invention.

FIG. 6 illustrates an example application of a transmission line including a reference plane having pattern voids corresponding to a location of a trace in the context of an electronic device according to some embodiments of the present invention.

Referring to FIG. 6, an electronic device 600 may include one or more transmission lines 100 including the pattern voids as described above with reference to FIGS. 1A through 5. The electronic device 600 may be any suitable electronic device, such as, for example, a display device, a mobile device, a touch pad, a computer, a blade server, a data storage cluster, etc.

If the electronic device 600 is a display device, the display device may include a timing controller 610, a scan driver 620, a data driver 630, and a plurality of pixels Px in a display area 640. Each of the plurality of pixels Px is coupled to respective ones of scan lines SL1 to SLn, where n is a positive integer, and data lines DL1 to DLj, where j is a positive integer, at crossing regions of the scan lines SL1 to SLn and the data lines DL1 to DLj. Each of the pixels Px receives a data signal from the data driver 630 through the respective one of the data lines DL1 to DLj, when a scan signal is received from the scan driver 620 through a respective one of the scan lines SL1 to SLn.

The timing controller 610 receives an image signal Image, a synchronization signal Sync, and a clock signal CLK from an external source (e.g., external to the timing controller). The timing controller 610 generates image data DATA, a data driver control signal DCS, and a scan driver control signal SCS. The synchronization signal Sync may include a vertical synchronization signal Vsync and a horizontal synchronization signal Hsync.

The timing controller 610 is coupled to (e.g., connected to) the data driver 630 and the scan driver 620 through respective channels including transmission lines 100. The timing controller 610 transmits the image data DATA and the data driver control signal DCS to the data driver 630, and transmits the scan driver control signal SCS to the scan driver 620 through the respective transmission lines 100. Each of the transmission lines 100 according to embodiments of the present invention may include the transmission lines having the same or substantially the same structure as any one of the transmission lines described in detail with reference to FIGS. 1A through 5 above, and thus, detailed description thereof will be omitted.

Accordingly, the transmission line according to some embodiments of the present invention may include one or more pattern voids in a reference plane located below and/or above the trace and overlapping the trace. The pattern voids may be utilized to control reflections of signals propagating through the trace to enhance and/or suppress the signals at certain frequencies (e.g., predetermined or desired frequencies).

In some embodiments, one end of the transmission line including the pattern voids may be coupled to a transmitter and another end of the transmission line including the pattern voids may be coupled to a receiver to suppress transmission in low frequencies, which may help to reduce inter-symbol interference.

In some embodiments, the transmission line including the pattern voids may be coupled to a transmission line including a uniform or substantially uniform reference plane at (or near) an input of the receiver to enhance transmission in high frequencies, which may compensate for signal attenuation from metal and dielectric losses.

In some embodiments, a first transmission line including the pattern voids may couple the transmitter to the receiver, and a second transmission line including the pattern voids may be coupled to the first transmission line at (or near) the input of the receiver to suppress transmission in low frequencies and enhance transmission in high frequencies.

Although the present invention has been described with reference to the example embodiments, those skilled in the art will recognize that various changes and modifications to the described embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:

1. An electronic device comprising:
    a transmitter;
    a receiver coupled to the transmitter;
    a first transmission line coupled between the transmitter and the receiver, the first transmission line comprising:
        a first trace;
        a third trace;
        an insulating substrate; and
        a first reference plane on the insulating substrate, the first reference plane having a plurality of first pattern voids overlapping the first trace, the plurality of first pattern voids being filled with insulating substrate; and
    a second transmission line,
    wherein a first end of the second transmission line is coupled to the transmitter and a second end of the second transmission line is coupled to the receiver,
    wherein a first end of the first transmission line is coupled to the second end of the second transmission line at an input of the receiver to enhance reflections of a signal transmitted between the transmitter and the receiver, and
    wherein the first transmission line further comprises a resistor directly connecting the first trace to the third trace, such that a first end of the resistor is directly connected to the first trace and a second end of the resistor is directly connected to the third trace, at a second end of the first transmission line.

2. The electronic device of claim 1, wherein each of the plurality of first pattern voids extends through the first reference plane.

3. The electronic device of claim 1, wherein the second transmission line comprises:
    a second trace; and
    a second reference plane including a plurality of second pattern voids overlapping the second trace.

4. The electronic device of claim 3, wherein the first transmission line is configured to enhance reflections of the signal at a first frequency, and the second transmission line is configured to suppress reflections of the signal at a second frequency different from the first frequency.

5. The electronic device of claim 1, wherein the second transmission line comprises:
    a second trace; and
    a second reference plane having a continuous thickness along the second trace.

6. The electronic device of claim 1, wherein the enhanced reflections of the signal transmitted between the first terminal and the second terminal, comprises a predefined frequency defined by a period between the plurality of first pattern voids.

7. A circuit board comprising:
a first terminal to be coupled to a transmitter;
a second terminal to be coupled to a receiver;
a first transmission line coupled between the first terminal and the second terminal, the first transmission line comprising:
a first trace;
a third trace;
an insulating substrate; and
a first reference plane on the insulating substrate, the first reference plane having a plurality of first pattern voids overlapping the first trace, the plurality of first pattern voids being filled with insulating substrate; and
a second transmission line,
wherein a first end of the second transmission line is coupled to the first terminal and a second end of the second transmission line is coupled to the second terminal,
wherein a first end of the first transmission line is coupled to the second end of the second transmission line at an input of the first terminal to enhance reflections of a signal transmitted between the first terminal and the second, and
wherein a resistor connects the first trace to the third trace, such that a first end of the resistor is directly connected to the first trace and a second end of the resistor is directly connected to the third trace, at a second end of the first transmission line.

8. The circuit board of claim 7, wherein each of the plurality of first pattern voids extend through the first reference plane.

9. The circuit board of claim 7, wherein the second transmission line comprises:
a second trace; and
a second reference plane including a plurality of second pattern voids overlapping the second trace.

10. The circuit board of claim 9, wherein the first transmission line is configured to enhance reflections of the signal at a first frequency, and the second transmission line is configured to suppress reflections of the signal at a second frequency different from the first frequency.

11. The circuit board of claim 7, wherein the second transmission line comprises:
a second trace; and
a second reference plane having a continuous thickness along the second trace.

12. A channel to be coupled to an input of a receiver, the channel comprising:
a first transmission line comprising:
a first trace;
a third trace;
an insulating substrate; and
a first reference plane on the insulating substrate, the first reference plane having a plurality of first pattern voids overlapping the first trace, the plurality of first pattern voids being filled with insulating substrate; and
a second transmission line,
wherein a first end of the second transmission line is to be coupled to a transmitter and a second end of the second transmission line is to be coupled to the receiver,
wherein a first end of the first transmission line is coupled to the second end of the second transmission line at an input of the receiver to enhance reflections of a signal transmitted between the transmitter and the receiver, and
wherein a second end of the first transmission line is terminated with a resistor connecting the first trace to the third trace, wherein a first end of the resistor is directly connected to the first trace and a second end of the resistor is directly connected to the third trace.

13. The channel of claim 12, wherein each of the plurality of first pattern voids extends through the first reference plane.

14. The channel of claim 12, wherein the second transmission line comprises: a second trace; and a second reference plane having a continuous thickness along the second trace.

15. The channel of claim 12, wherein the second transmission line comprises:
a second trace; and
a second reference plane including a plurality of second pattern voids overlapping the second trace.

16. The channel of claim 15, wherein:
each of the plurality of second pattern voids extends through the first reference plane, and
each of the plurality of second pattern voids extends through the second reference plane.

17. The channel of claim 12, wherein the first transmission line is configured to enhance reflections of the signal at a first frequency, and the second transmission line is configured to suppress reflections of the signal at a second frequency different from the first frequency.

* * * * *